(12) United States Patent
Katagiri et al.

(10) Patent No.: US 8,093,503 B2
(45) Date of Patent: Jan. 10, 2012

(54) MULTILAYER WIRING BOARD

(75) Inventors: Hiroshi Katagiri, Kasugai (JP); Toshiya Asano, Ichinomiya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 397 days.

(21) Appl. No.: 12/403,525

(22) Filed: Mar. 13, 2009

(65) Prior Publication Data
US 2009/0229874 A1 Sep. 17, 2009

(30) Foreign Application Priority Data

Mar. 13, 2008 (JP) ................ P2008-064987

(51) Int. Cl.
*H05K 1/03* (2006.01)
(52) U.S. Cl. ........................... 174/255
(58) Field of Classification Search ........... 174/255, 174/260–266; 361/792–795
See application file for complete search history.

(56) References Cited

U.S. PATENT DOCUMENTS

| | | | |
|---|---|---|---|
| 6,418,615 B1 | 7/2002 | Rokugawa et al. | |
| 6,441,314 B2 | 8/2002 | Rokugawa et al. | |
| 6,931,724 B2 | 8/2005 | Rokugawa et al. | |
| 7,926,175 B2 * | 4/2011 | Ohara et al. | 29/846 |
| 2004/0089470 A1 | 5/2004 | Shimoto et al. | |
| 2005/0017271 A1 | 1/2005 | Rokugawa et al. | |

FOREIGN PATENT DOCUMENTS

| JP | 2001-257474 | * | 9/2001 |
|---|---|---|---|
| JP | 2003-133687 | * | 5/2003 |
| JP | 3635219 | * | 1/2005 |
| JP | 3841079 | * | 8/2006 |

* cited by examiner

*Primary Examiner* — Javaid Nasri
(74) *Attorney, Agent, or Firm* — Stites & Harbison PLLC; Jeffrey A. Haeberlin

(57) ABSTRACT

A coreless wiring board has no core board but a laminated structure in which a conductor layer and resin insulating layers are alternately laminated into a multilayer. Each of the resin insulating layers is formed to contain a glass cloth in an epoxy resin. A plurality of via holes taking a shape of an inverse truncated cone and having steps on internal wall surfaces is formed to penetrate each of the resin insulating layers, and a filled via conductor for electrically connecting the conductors is formed in each of the via holes.

5 Claims, 8 Drawing Sheets

MULTILAYER WIRING BOARD

CROSS-REFERENCE TO RELATED APPLICATIONS

This application is based upon and claims priority from Japanese Patent Application No. 2008-064987 filed on Mar. 13, 2008, the entire contents of which are incorporated herein by reference.

BACKGROUND OF THE INVENTION

1. Field of the Invention

The present disclosure relates to a multilayer wiring board having no core board but a laminated structure in which a conductor layer and an insulating layer are alternately laminated into a multilayer.

2. Description of Related Art

In recent years, a semiconductor integrated circuit device (an IC chip) to be used as a microprocessor of a computer has increasingly been enhanced in a speed and a function, and incidentally, there is a tendency that the number of terminals is increased and a pitch between the terminals is also reduced. In general, a large number of terminals are densely disposed in an array on a bottom face of the IC chip, and the terminal group is connected to that on a mother board side in a configuration of a flip chip. However, a great difference is made in a pitch between the terminals on the IC chip and the mother board side. Therefore, it is hard to directly connect the IC chip onto the mother board. For this reason, there is usually employed a technique for fabricating a package having the IC chip mounted on an IC chip mounting wiring board and mounting the package on the mother board.

For the IC chip mounting wiring board constituting the package of this type, there has been practically used a multilayer wiring board having buildup layers formed on a surface and a back face of a core board. In the multilayer wiring board, a resin board (such as a glass epoxy board) obtained by impregnating a reinforcing fiber with a resin is used for the core board, for example. By utilizing a rigidity of the core board, an insulating layer and a conductor layer are alternately laminated on a surface and a back face of the core board so that buildup layers are formed. In other words, in the multilayer wiring board, the core board plays a part in a reinforcement and is formed much more thickly than the buildup layers. Moreover, a wiring for conducting the buildup layers formed on the surface and the back face is provided to penetrate the core board (more specifically, a through hole conductor).

In recent years, a signal frequency to be used has been present in a radio frequency band with an increase in a speed of a semiconductor integrated circuit device. In this case, the wiring penetrating the core board contributes as a high inductance so that a transmission loss of a radio frequency signal or a circuit malfunction is caused, resulting in a disturbance of the increase in the speed. In order to solve the problem, a coreless wiring board having no core board has been proposed as an IC chip mounting wiring board (for example, see JP-B-3635219 and JP-B-3841079). Referring to the coreless wiring board, a comparatively thick core board is omitted so that a whole wiring length is reduced. Therefore, the transmission loss of the radio frequency signal is reduced so that the semiconductor integrated circuit device can be operated at a high speed.

Since the coreless wiring board is manufactured through the omission of the core board, however, a strength thereof cannot be maintained sufficiently. Accordingly, the coreless wiring board is apt to be warped. There is a high possibility that an adhesion failure or a via slip-off of a via conductor for connecting the conductor layers in the buildup layer might be caused in the case in which an excessive stress is applied to the wiring board due to the warpage. As a result, a product yield of the coreless wiring board is deteriorated.

BRIEF SUMMARY OF THE INVENTION

Exemplary embodiments of the present invention provide a multilayer wiring board capable of increasing an adhesion strength of a via and enhancing a product yield.

A multilayer wiring board according to a first aspect of the present invention, having no core board, comprising: a laminated structure in which conductor layers and at least one insulating layer are alternately laminated into a multilayer, the insulating layer having a plurality of via holes penetrating the insulating layer and a plurality of filled via conductors formed in the via holes respectively for electrically connecting the conductor layers, each of the via hole taking a shape of an inverse truncated cone and having a step on an internal wall surface.

According to the multilayer wiring board of the first aspect, therefore, the core board is not provided. Therefore, it is possible to reduce a thickness of the wiring board and to decrease a wiring length of the whole board. Consequently, it is possible to enhance an electrical characteristic of the wiring board. Furthermore, the via hole formed on the insulating layer takes a shape of an inverse truncated cone and has the step on the internal wall surface. Consequently, an adhesion strength of the filled via conductor formed in the via hole is increased. Also in the case in which the wiring board is warped so that an excessive stress is applied, accordingly, it is possible to avoid a drawback of an adhesion failure of a via or a via slip-off.

The multilayer wiring board having no core according to the invention can include "a multilayer wiring board constituted by identical insulating layers as a main body" and "a multilayer wiring board connecting each conductor layer through only a via having a diameter increased in the same direction".

It is preferable that the insulating layer should contain an fiber in a polymeric material. Consequently, the strength of the multilayer wiring board can be increased, and furthermore, the adhesion failure of the via or the via slip-off is caused with difficulty because the via hole is deformed with difficulty.

The step is formed corresponding to a depth position in which the fiber is present in the insulating layer. More specifically, in the formation of the via hole through the laser processing, a part of a laser beam is scattered by the fiber. Therefore, a processability of the fiber is changed in upper and lower parts thereof. Consequently, the step is formed in a position in which a protruded end of the fiber is present in the via hole. In the insulating layer, moreover, it is preferable that the fiber should be provided on an almost center in a vertical direction in a polymeric material. Thus, it is possible to form the step of the via hole in a central part of the insulating layer.

The step may be formed corresponding to a depth position in which a protruded end of the fiber is present and an inclination angle of a via opening side region based on a via bottom face may be greater than that of a via bottom side region based on the via bottom face in the case in which the internal wall surface is divided into the via opening side region and the via bottom side region with the step set to be a boundary.

In the case in which the step is formed corresponding to the depth position in which the protruded end of the fiber is present and the internal wall surface is divided into the via opening side region and the via bottom side region with the step set to be the boundary, the inclination angle of the via opening side region based on the via bottom face may be smaller than that of the via bottom side region based on the via bottom face.

The conductor layer is pattern-formed on the interlayer insulating film by a well-known method such as a subtractive process, a semiadditive process or a fully-additive process. Examples of a metallic material to be used for forming the conductor layer include copper, a copper alloy, nickel, a nickel alloy, tin and a tin alloy.

The insulating layer can be properly selected in consideration of an insulating property, a heat resistance or a moisture resistance. Suitable examples of the polymeric material for forming the insulating layer include a thermosetting resin such as an epoxy resin, a phenol resin, an urethane resin, a silicone resin or a polyimide resin, and a thermoplastic resin such as a polycarbonate resin, an acrylic resin, a polyacetal resin or a polypropylene resin. Moreover, examples of the fiber material are not limited to a particular material and may be an organic fiber or an inorganic fiber. Examples of the organic fiber include a paper, a nonwoven cellulose fabric, a nonwoven aramid fabric, a nylon fiber and a polyester fiber. In this case, the inorganic fiber may include a polymeric material different from the polymeric material for forming the insulating layer. The use of the different polymeric materials can facilitate, as compared with the user of the same polymeric materials, a selective removal of an internal wall surface of the via hole such that the internal wall surface recedes in a direction increasing a diameter of the via hole. Examples of the inorganic fiber contained in the polymeric material include a glass fiber (a glass woven fabric or a nonwoven glass fabric) and a ceramic fiber. The use of the inorganic fiber has advantages to obtain more easily, as compared with the user of organic fiber, a high strength of the insulating layer, a low coefficient of thermal expansion (CTE), a high adhesion strength of the filled via conductor in the via hole. On the other hand, the use of the organic fiber has advantages to obtain more easily, as compared with the use of the inorganic fiber, an improved workability of the insulating layer and a reduced cost. The fiber material contained in the polymeric material may contain both the organic fiber and the inorganic fiber.

The multilayer wiring board is manufactured by the following manufacturing method.

First of all, at the insulating layer forming step, the insulating layer is formed by using the sheet-shaped buildup material containing the inorganic fiber in the polymeric material. At the via hole forming step, then, a laser beam is irradiated on the insulating layer so that a plurality of via holes is formed. At this time, the inorganic fiber in the polymeric material is also burnt and cut by the laser beam. At this time, moreover, a part of the laser beam is scattered by the inorganic fiber. Therefore, a laser processing property is varied in upper and lower parts of the inorganic fiber. Consequently, a step is formed corresponding to a position in which the inorganic fiber is protruded over the internal wall surface of the via hole. At a via conductor forming step, thereafter, plating is carried out so that a filled via conductor is formed in the via holes.

According to the manufacturing method, the step is formed on the internal wall surface of the via hole and the filled via conductor is formed in the via hole. Therefore, an adhesion strength of the filled via conductor in the via hole is increased. Also in the case in which the wiring board is warped so that an excessive stress is applied, accordingly, it is possible to avoid a drawback such as an adhesion failure of a via or a via slip-off.

Other features and advantages may be apparent from the following detailed description, the accompanying drawings and the claims.

DETAILED DESCRIPTION

Figure 1:
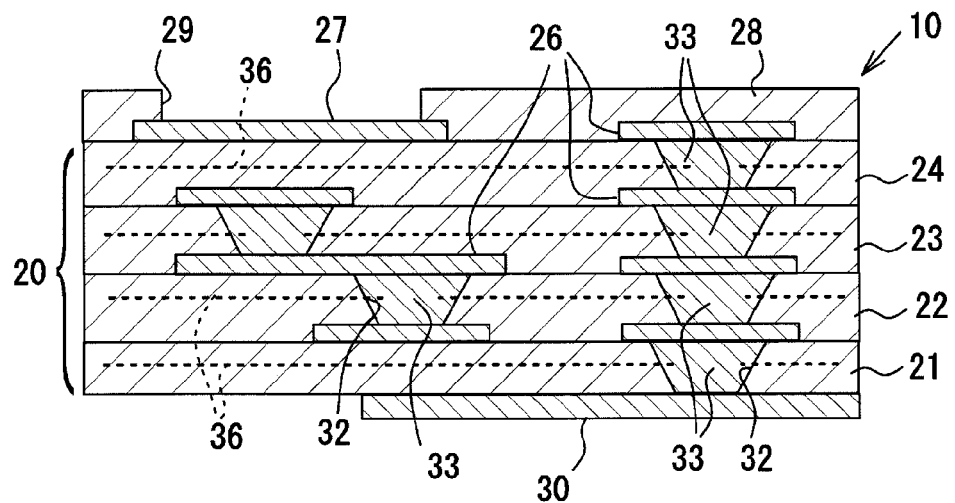
FIG. 1 is a sectional view showing a schematic structure of a coreless wiring board according to the embodiment.
Figure 2:
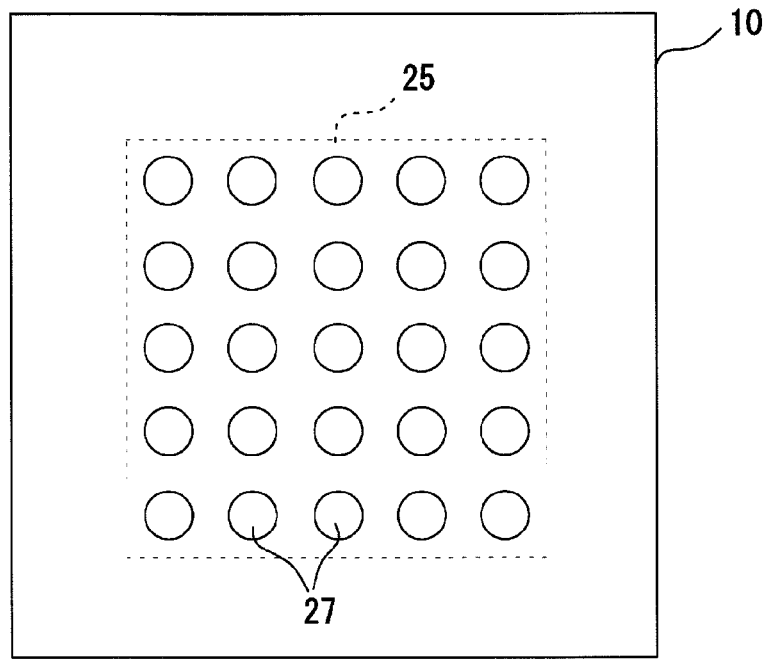
FIG. 2 is a plan view showing the coreless wiring board according to the embodiment.

An embodiment according to the invention will be described below in detail with reference to the drawings. FIG. 1 is an enlarged sectional view showing a schematic structure of a coreless wiring board (a multilayer wiring board) according to the embodiment and FIG. 2 is a plan view showing the coreless wiring board.

As shown in FIG. 1, a coreless wiring board 10 has no core board but a wiring laminated portion 20 (a laminated structure) in which four resin insulating layers (insulating layers) 21, 22, 23 and 24 formed of an epoxy resin and a conductor layer 26 formed of copper are alternately laminated into a multilayer. In the coreless wiring board 10, a terminal pad 27 is provided on a surface (an upper surface) of the resin insulating layer 24 to be the fourth layer. FIG. 1 is a sectional view showing a part of the coreless wiring board 10. A plurality of terminal pads 27 is disposed in an array on an upper surface of the coreless wiring board 10, for example (see FIG. 2).

Moreover, the surface of the resin insulating layer 24 is almost wholly covered with a solder resist 28. An opening portion 29 for exposing each of the terminal pads 27 is formed on the solder resist 28. An IC chip (a semiconductor integrated circuit device) is flip-chip connected to each of the exposed terminal pads 27 through a solder bump which is not shown. As shown in FIG. 2, a region in which the terminal pads 27 are densely formed over the upper surface (main surface) of the coreless wiring board 10 will be referred to as a device mounting region 25.

A pad 30 for an LGA (land grid array) is disposed in an array on a surface (a lower surface) of the resin insulating layer 21 to be the first layer. Moreover, a via hole 32 and a filled via conductor 33 are provided on the resin insulating layers 21, 22, 23 and 24, respectively. The via conductor 33 has a diameter increased in the same direction (an upward direction in the drawing), and the conductor layer 26, the terminal pad 27 and the pad 30 for an LGA are connected to each other mutually and electrically. The pad 30 for an LGA is electrically connected to a mother board which is not shown.

Figure 3:
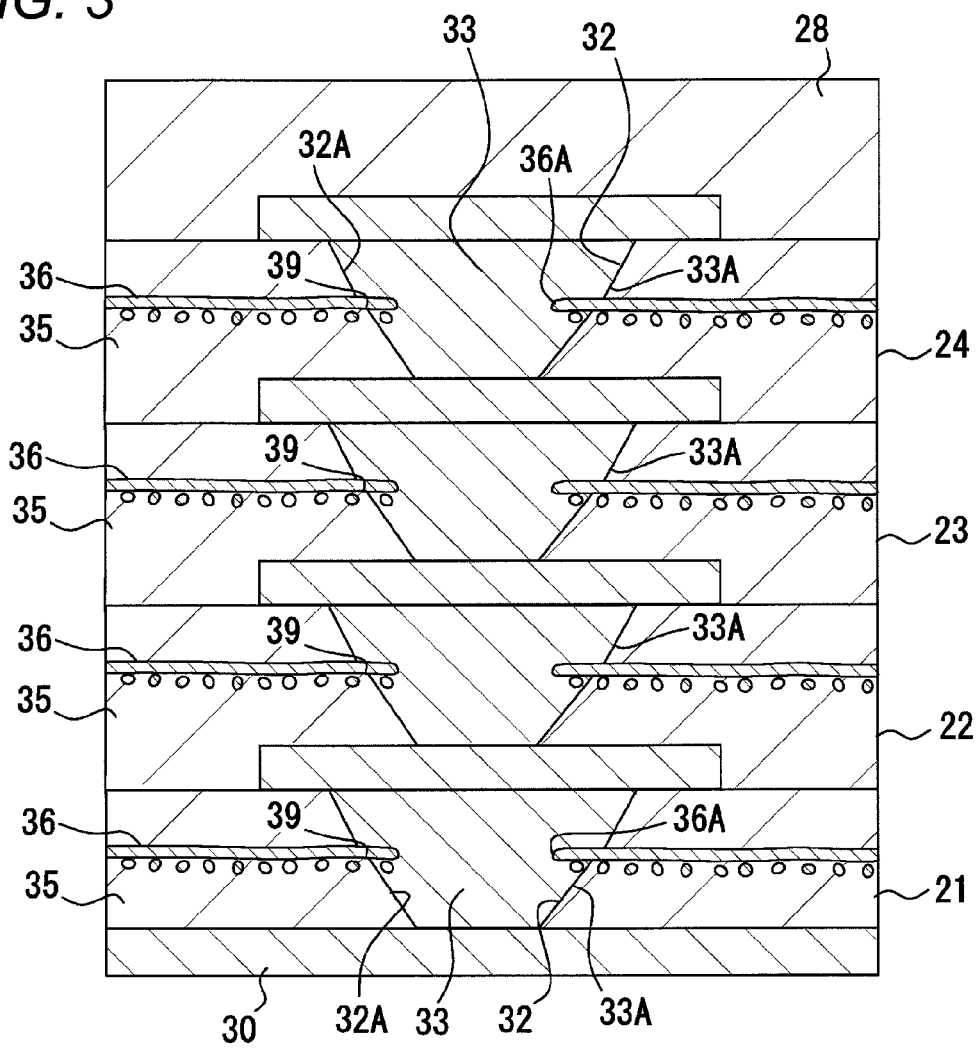
FIG. 3 is an enlarged sectional view showing a via hole forming portion in the coreless wiring board.

As shown in FIG. 3, the resin insulating layers 21 to 24 according to the embodiment are insulating layers having identical thicknesses and materials and are formed by using a buildup material obtained by impregnating a glass cloth 36 (an inorganic fiber) with an epoxy resin 35 (a polymeric material), for example. Moreover, each via hole 32 takes a shape of an inverse truncated cone and is formed to penetrate the resin insulating layers 21 to 24. The via hole 32 is formed by carrying out perforating using a YAG laser or a carbon dioxide gas laser over each of the resin insulating layers 21 to 24. An upper part of the via hole 32 has a diameter of approximately 70 μm and a bottom part thereof has a diameter of approximately 50 μm.

The glass cloth 36 is disposed in an almost central part in a vertical direction of each of the resin insulating layers 21 to 24. The glass cloth 36 in the via hole 32 is burnt and cut by a laser processing and a tip 36A is protruded in two orthogonal directions in an internal wall surface 32A of the via hole 32. The tip 36A of the glass cloth 36 takes a rounded shape and cuts into a side wall 33A of the filled via conductor 33 formed in the via hole 32. In the embodiment, a degree of protrusion of the tip 36A of the glass cloth 36 is approximately ⅕ of the diameter of the via hole 32. More specifically, the degree of protrusion is an amount of protrusion of 5 μm to 15 μm, for example. Moreover, a step 39 is formed on the internal wall surface 32A of the via hole 32 corresponding to a depth position in which the tip 36A (a protruded end) of the glass cloth 36 is present.

The coreless wiring board 10 having the structure is fabricated in the following procedure, for example.

In the embodiment, there is employed a method of preparing a support board (a glass epoxy board) having a sufficient strength and building up, on the support board, the resin insulating layers 21 to 24 and the conductor layer 26 in the coreless wiring board 10. FIGS. 4 to 15 are explanatory views showing the manufacturing method, illustrating the resin insulating layers 21 to 24 and the conductor layer 26 which are formed on an upper surface side of the support board. The resin insulating layers 21 to 24 and the conductor layer 26 are also formed on a lower surface side of the support board, which is not shown.

Figure 4:
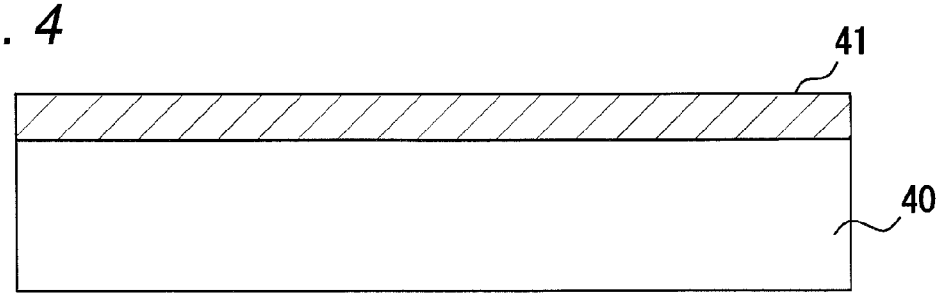
FIG. 4 is an explanatory view showing a method of manufacturing the coreless wiring board.
Figure 5:
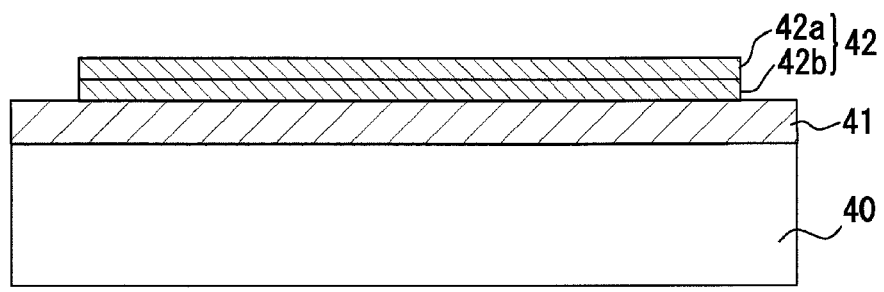
FIG. 5 is an explanatory view showing the method of manufacturing the coreless wiring board.

As will be described in detail, as shown in FIG. 4, a sheet-like insulating resin base material formed of an epoxy resin is stuck onto a support board 40 in a semicuring state so that a ground resin insulating layer 41 is formed. As shown in FIG. 5, a laminated metal sheet body 42 is then disposed on an upper surface of the ground resin insulating layer 41. By disposing the laminated metal sheet body 42 on the ground resin insulating layer 41 in the semicuring state, it is possible to ensure such an adhesion that the laminated metal sheet body 42 is not peeled from the ground resin insulating layer 41 at subsequent manufacturing steps. The laminated metal sheet body 42 is obtained by bonding two copper foils 42a and 42b in a state in which they can be peeled. More specifically, the copper foils 42a and 42b are laminated through metal plating (for example, chromium plating) so that the laminated metal sheet body 42 is formed.

Figure 6:
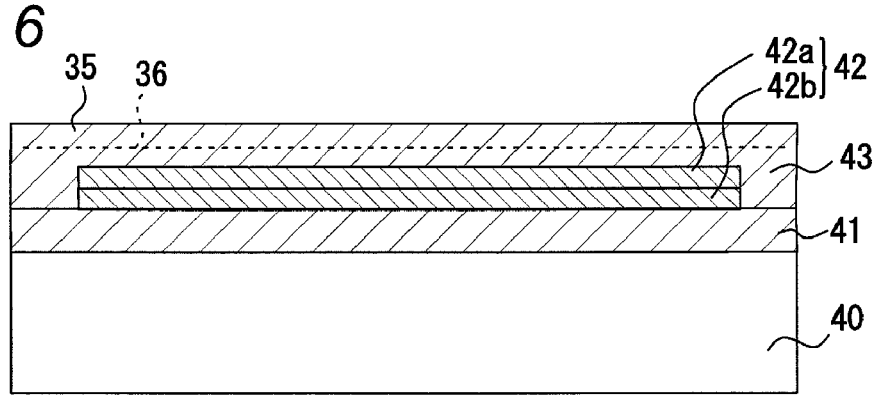
FIG. 6 is an explanatory view showing the method of manufacturing the coreless wiring board.
Figure 7:
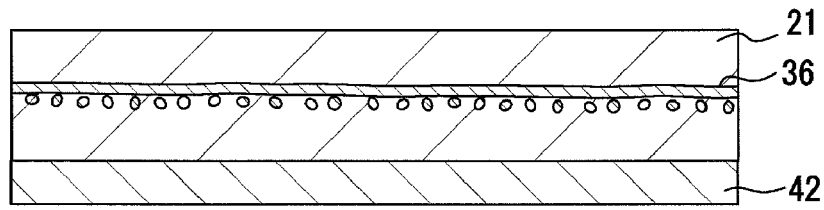
FIG. 7 is an explanatory view showing the method of manufacturing the coreless wiring board.

As shown in FIG. 6, then, a sheet-like insulating resin base material 43 is disposed to enclose the laminated metal sheet body 42 and is pressurized and heated in vacuum by using a vacuum contact bonding thermal press machine (not shown) to cure the insulating resin base material 43 so that the resin insulating layer 21 to be the first layer is formed (an insulating layer forming step). The resin insulating layer 21 is bonded to the laminated metal sheet body 42 and is bonded to the ground resin insulating layer 41 in a surrounding region of the laminated metal sheet body 42 so that the laminated metal sheet body 42 is sealed. For the insulating resin base material 43, there is used the buildup material obtained by impregnating the glass cloth 36 with the epoxy resin 35. Accordingly, the resin insulating layer 21 is formed with the glass cloth 36 contained therein (see FIG. 7).

Figure 8:
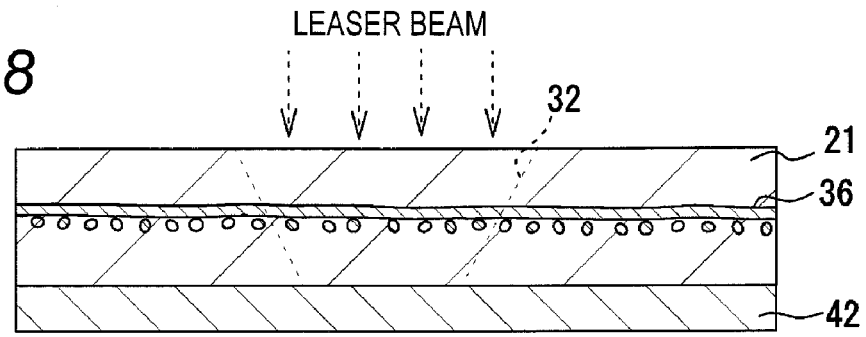
FIG. 8 is an explanatory view showing the method of manufacturing the coreless wiring board.

As shown in FIG. 8, thereafter, a plurality of via holes 32 is formed on the resin insulating layer 21 by carrying out a laser processing (a via hole forming step). At this time, the glass cloth 36 in the resin insulating layer 21 is also burnt and cut by the laser processing. At this time, moreover, the tip 36A of the glass cloth 36 thus cut is molten by a thermal energy in the laser processing and is then hardened to take a rounded shape. In the formation of the via hole, furthermore, a part of a laser beam is scattered through the glass cloth 36. Therefore, a laser processing property is changed in the upper and lower parts of the glass cloth 36 so that the step 39 is formed corresponding to a position in which the glass cloth 36 is present.

Figure 9:
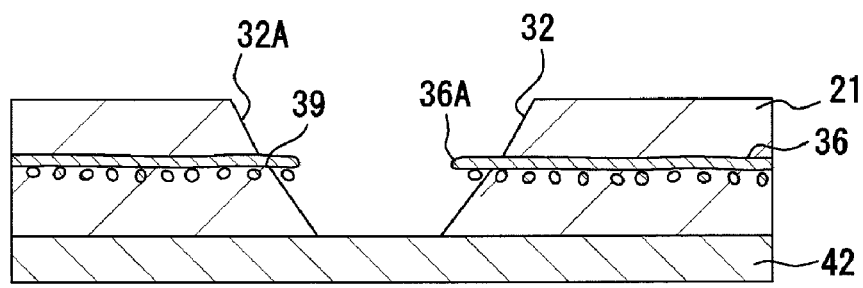
FIG. 9 is an explanatory view showing the method of manufacturing the coreless wiring board.
Figure 10:
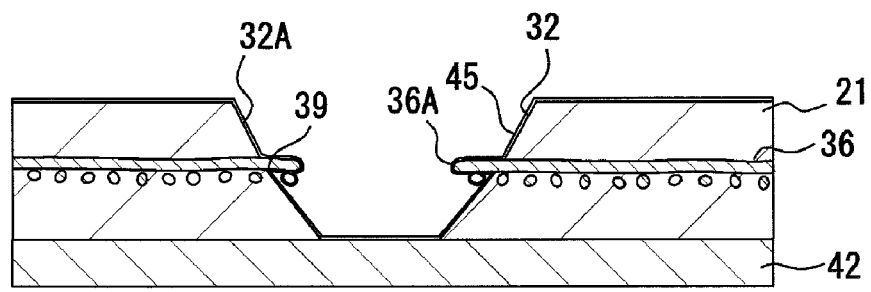
FIG. 10 is an explanatory view showing the method of manufacturing the coreless wiring board.
Figure 11:
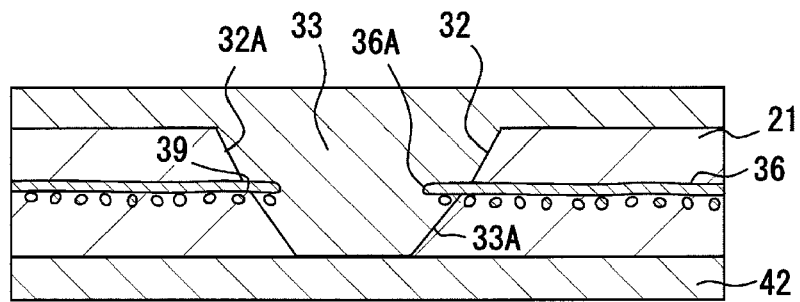
FIG. 11 is an explanatory view showing the method of manufacturing the coreless wiring board.
Figure 12:
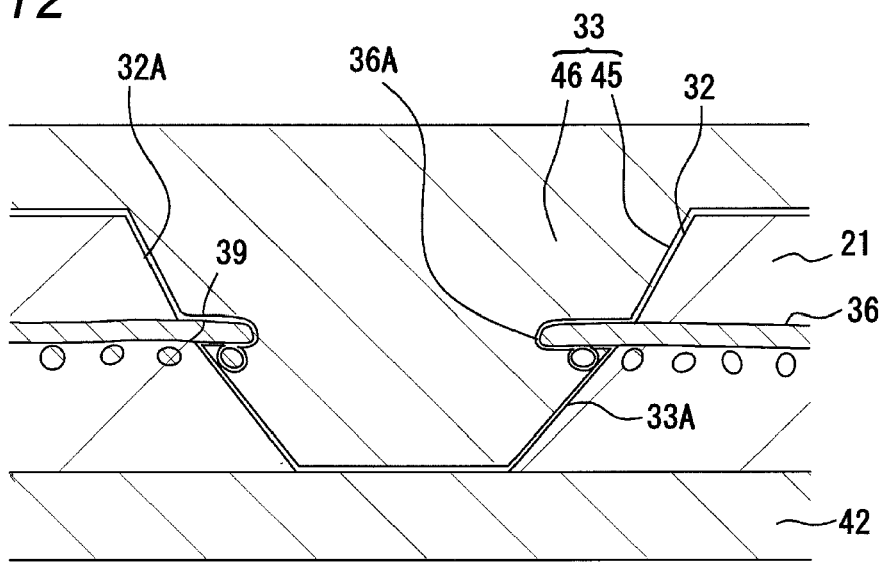
FIG. 12 is an enlarged sectional view showing a filled via conductor.
Figure 13:
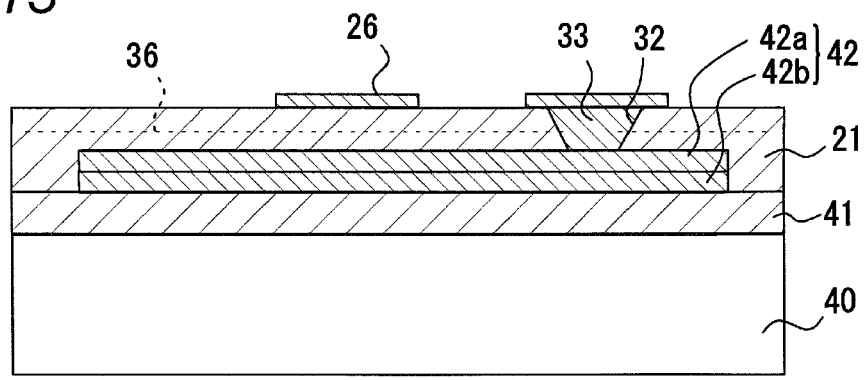
FIG. 13 is an explanatory view showing the method of manufacturing the coreless wiring board.

Subsequently, a desmear treatment for removing a smear in each of the via holes 32 is carried out. By the desmear treatment, the epoxy resin on the internal wall surface 32A in the via hole 32 is selectively removed and is retreated in a diameter increasing direction. As shown in FIG. 9, consequently, the tip 36A of the glass cloth 36 is protruded from the internal wall surface 32A of the via hole 32. By carrying out a chemical treatment for melting the surface of the epoxy resin in addition to the desmear treatment, for example, it is also possible to selectively remove the epoxy resin, thereby retreating the surface in the diameter increasing direction.

Then, plating is carried out to form the filled via conductor 33 in each of the via holes 32 (a via conductor forming step). In more detail, electroless copper plating is carried out to form a electroless plated layer 45 having a predetermined thicknesses (more specifically, for example, a thickness of approximately 0.1 μm to 1 μm) on the surface of the via hole 32 and that of the glass cloth 36 (see FIG. 10). Thereafter, electrolytic copper plating is carried out to form the filled via conductor 33 in the via hole 32 (see FIG. 11). In the embodiment, the filled via conductor 33 is formed by the electroless plated layer 45 covering the surfaces of the via hole 32 and the glass cloth 36 and an electrolytic plated layer 46 (see FIG. 12). Furthermore, etching is carried out by a conventionally well-known method (for example, a semiadditive process) to pattern-form the conductor layer 26 on the resin insulating layer 21 (see FIG. 13).

The resin insulating layers 22 to 23 to be the second to fourth layers and the conductor layer 26 are also formed by the same method for the resin insulating layer 21 to be the first layer and the conductor layer 26, and are built up over the resin insulating layer 21. Then, a photosensitive epoxy resin is applied and cured on the resin insulating layer 24 on which the terminal pad 27 is formed so that the solder resist 28 is formed. Next, an exposure and a development are carried out in a state in which a predetermined mask is disposed, and the opening portion 29 is thus formed on the solder resist 28 by patterning. By the manufacturing process, there is formed a laminated body 50 having the laminated metal sheet body 42, the resin insulating layers 21 to 24 and the conductor layer 26 laminated on the support board 40 (see FIG. 14). In the laminated body 50, a region positioned on the laminated metal sheet body 42 serves as the wiring laminated portion 20 (the laminated structure) to be the coreless wiring board 10.

Figure 14:
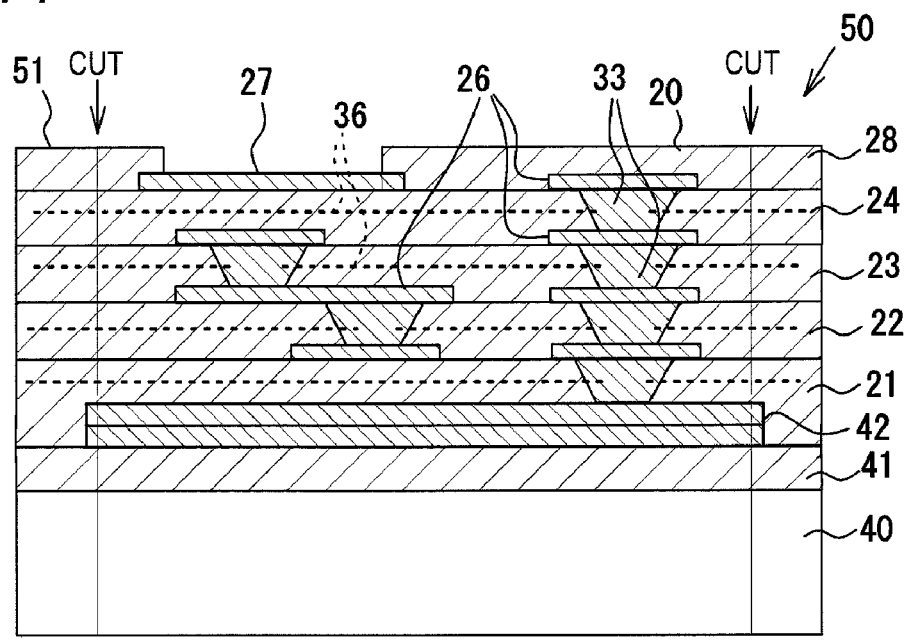
FIG. 14 is an explanatory view showing the method of manufacturing the coreless wiring board.

The laminated body 50 is cut by a dicing device (not shown) and a surrounding region of the wiring laminated portion 20 in the laminated body 50 is removed. In this case, as shown in FIG. 14, the ground resin insulating layer 41 and the support board 40 which are provided below the wiring laminated portion 20 are cut together on a boundary between the wiring laminated portion 20 and a surrounding portion 51 thereof. By the cutting operation, an outer edge part of the laminated metal sheet body 42 sealed with the resin insulating layer 21 is exposed. In other words, by the removal of the surrounding portion 51, a bonded portion of the ground resin insulating layer 41 and the resin insulating layer 21 is lost. As a result, the wiring laminated portion 20 and the support board 40 are coupled to each other through only the laminated metal sheet body 42.

Figure 15:
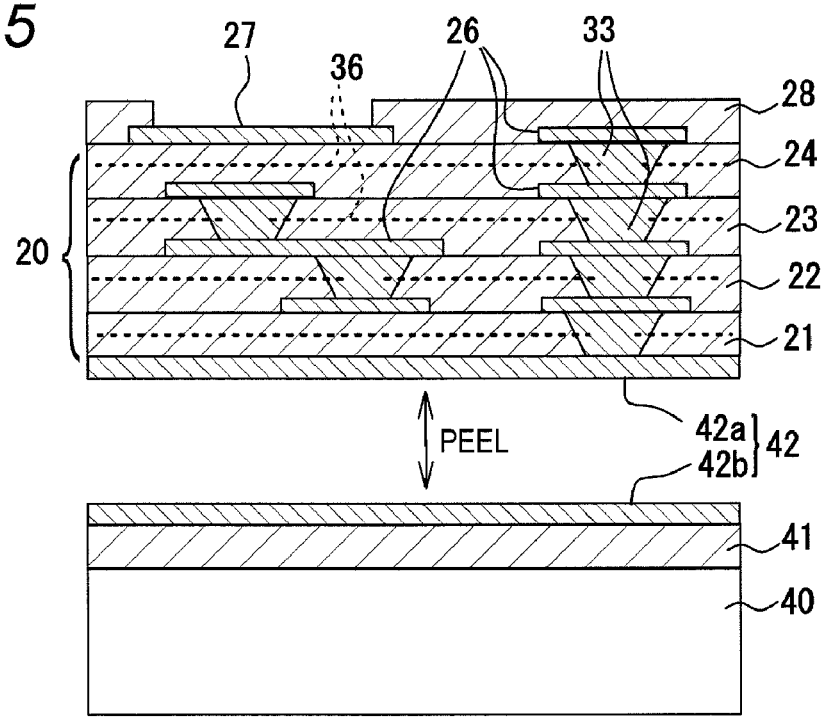
FIG. 15 is an explanatory view showing the method of manufacturing the coreless wiring board.

As shown in FIG. 15, thereafter, peeling is carried out on an interface between two copper foils 42a and 42b in the laminated metal sheet body 42 to separate the wiring laminated portion 20 from the support board 40. Subsequently, the copper foil 42a provided on the lower surface of the wiring laminated portion 20 (the resin insulating layer 21) is subjected to patterning through etching so that the pad 30 for an LGA is formed. Consequently, the coreless wiring board 10 shown in FIG. 1 is obtained.

Figure 16:
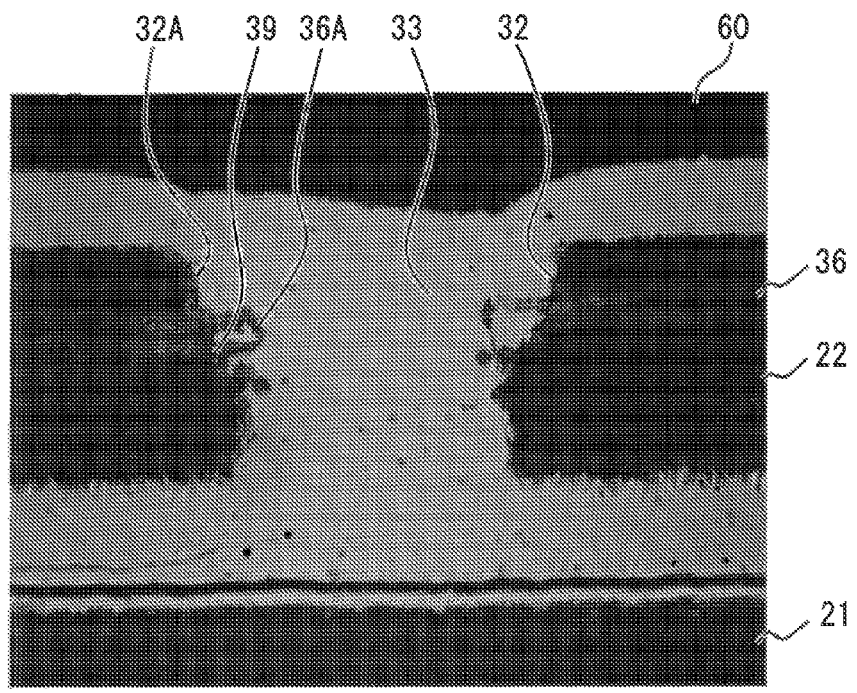
FIG. 16 is an explanatory view showing an SEM photograph for a via hole according to the embodiment.
Figure 17:
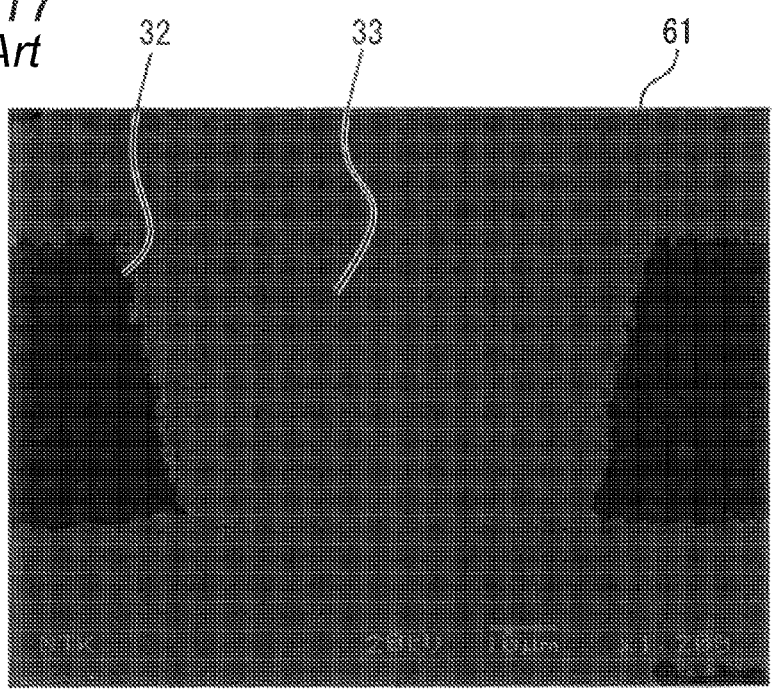
FIG. 17 is an explanatory view showing an SEM photograph for a conventional via hole.

The inventors cut the coreless wiring board 10 manufactured by the method in a vertical direction on an axis of the filled via conductor 33 and observed a cut surface of the filled via conductor 33 by an electron microscope (SEM). FIG. 16 shows an SEM photograph 60 for the cut surface in the filled via conductor 33. Moreover, FIG. 17 shows, as a comparative example, an SEM photograph 61 of the filled via conductor 33 in the conventional wiring board formed by using a general buildup material which does not contain the glass cloth 36. As shown in FIG. 16, the filled via conductor 33 is formed without a clearance in a state in which the tip 36A of the glass cloth 36 is protruded in the via hole 32 and an adhesion of the filled via conductor 33 is sufficiently ensured. Furthermore, it was confirmed that the step 39 is formed in the protruded portion of the glass cloth 36 on the surface of the via hole 32 and the inclination angle is varied by setting the step 39 as a boundary. The step 39 is not formed on the conventional via hole 32 shown in FIG. 17. It can be supposed that the step 39 is formed because a part of the laser beam in the laser processing for the via hole 32 is scattered through the glass cloth 36 and a direction of advance of the beam is thus changed.

Figure 18:
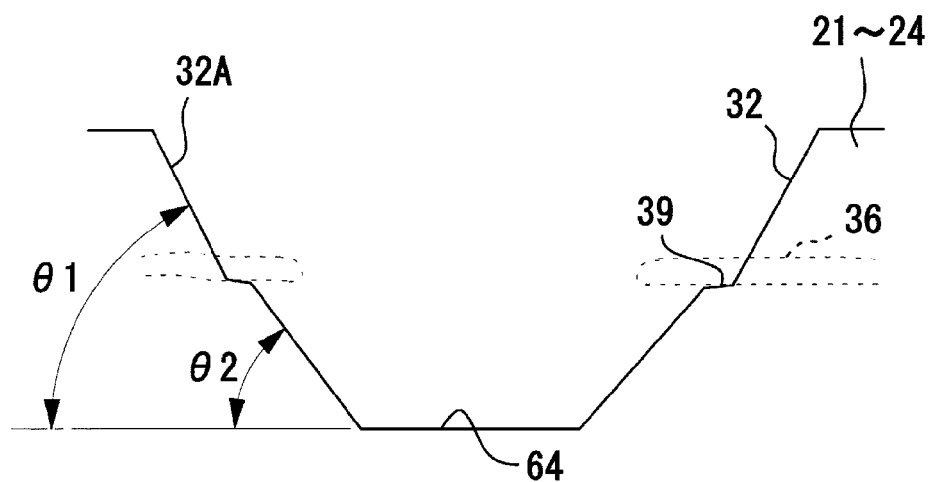
FIG. 18 is an explanatory view showing a shape of the via hole according to the embodiment.

In more detail, as shown in FIG. 18, the step 39 in the via hole 32 is formed corresponding to the depth position in which the glass cloth 36 is present in the resin insulating layers 21 to 24. In the case in which a via opening side region (an upper region in FIG. 18) and a bottom side region (a lower region in FIG. 18) are divided from each other by setting the step 39 as a boundary in the via hole 32, moreover, an inclination angle $\theta 1$ of the via opening side region based on a via bottom face 64 is greater than an inclination angle $\theta 2$ of the via bottom side region based on the via bottom face 64 ($\theta 1 > \theta 2$).

Furthermore, a size of the via hole 32 was confirmed based on the SEM photograph 60 for a plurality of (more specifically, nine) via holes 32. As a result, a mean diameter of a top part in the via hole 32 (a Top diameter) was 72 μm and a mean diameter of the bottom part (a Bottom diameter) was 50 μm. Moreover, a mean interval between tip portions of the glass cloth 36 which are protruded into the via hole 32 was 35 μm. Referring to a size of the via hole in the conventional wiring board, a mean Top diameter was 70 μm and a mean Bottom diameter was 55 μm.

According to the embodiment, therefore, the following advantages can be obtained.

(1) In the coreless wiring board 10 according to the embodiment, the resin insulating layers 21 to 24 are formed with the glass cloth 36 contained in the epoxy resin 35. Therefore, it is possible to sufficiently increase the strength of the wiring board 10. Moreover, the via hole 32 formed on each of the resin insulating layers 21 to 24 takes the shape of the inverse truncated cone and has the step 39 on the internal wall surface 32A. Consequently, a surface area of the internal wall surface 32A of the via hole 32 can be ensured fully and the adhesion strength of the filled via conductor 33 formed in the via hole 32 can be increased. Also in the case in which the coreless wiring board 10 is warped so that an excessive stress is applied, therefore, it is possible to avoid a drawback such as a bonding failure of the filled via conductor 33 or a via slip-off.

(2) In the coreless wiring board 10 according to the embodiment, the glass cloth 36 is provided on almost the center in the vertical direction of the resin insulating layers 21 to 24, and the step 39 of the via hole 32 is formed corresponding to the depth position in which the protruded end 36A of the glass cloth 36 is present. In this case, the step 39 in the via hole 32 can be formed in the central parts of the resin insulating layers 21 to 24.

(3) In the coreless wiring board 10 according to the embodiment, the tip 36A of the glass cloth 36 which is protruded from the internal wall surface 32A of the via hole 32 cuts into the side wall 33A of the filled via conductor 33. Therefore, it is possible to sufficiently increase the adhesion strength of the filled via conductor 33 in the via hole 32.

The embodiment according to the invention may be changed in the following manner.

Although each of the resin insulating layers 21 to 24 of the coreless wiring board 10 is constituted to contain the glass cloth 36 in the embodiment, it may be formed by a polymeric material which does not contain the glass cloth 36. In this case, moreover, each of the resin insulating layers 21 to 24 may be formed by sticking two types of buildup materials having different laser processing properties together and the laser processing may be carried out to form the via hole 32 having the step 39 shown in FIG. 18, for example. Alternatively, laser conditions may be changed to form the via hole 32 having the step 39. For example, it is possible to form the via hole 32 by carrying out a laser processing on a first laser condition and then performing a laser processing on a second laser condition. As an example of the first condition and the second condition, a spot diameter is set relatively large in the first condition and relatively small in the second condition. As another example, energy per a pulse is set relatively large in the first condition and relatively small in the second condition.

Figure 19:
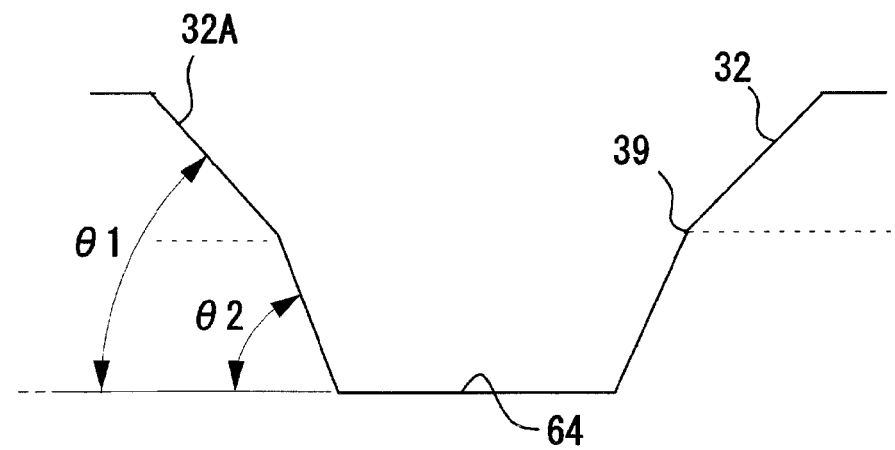
FIG. 19 is an explanatory view showing a shape of a via hole according to another embodiment.

For the shape of the via hole 32 in each of the resin insulating layers 21 to 24, moreover, it is not necessary to set the inclination angle θ1 on the upper side of the step 39 (the inclination angle of the via opening side region) to be greater than the inclination angle θ2 on the lower side thereof (the inclination angle of the via bottom side region) as shown in FIG. 18. For example, as shown in FIG. 19, the via hole 32 may be formed in such a manner that the inclination angle θ1 on the upper side of the step 39 is smaller than the inclination angle θ2 on the lower side thereof (θ1<θ2). Similarly, it is possible to increase the adhesion strength of the filled via conductor 33 in the via hole 32.

While the package configuration of the coreless wiring board 10 is an LGA (land grid array) in the embodiment, the invention is not restricted to only the LGA but a PGA (pin grid array) or a BGA (ball grid array) may be used, for example.

Next, the technical thoughts grasped by the embodiments are as follows.

(1) A multilayer wiring board has no core board and has a laminated structure in which a conductor layer and an insulating layer are alternately laminated into a multilayer. The multilayer wiring board has a main surface to which a device mounting region for mounting a semiconductor integrated circuit device is set. The insulating layer contains an inorganic fiber in a polymeric material. A plurality of via holes taking a shape of an inverse truncated cone and having steps on internal wall surfaces is formed to penetrate the insulating layer. A filled via conductor for electrically connecting the conductor layers is formed in each of the via holes. The step is formed corresponding to a depth position in which a protruded end of the inorganic fiber is present. An inclination angle of a via opening side region based on a via bottom face is smaller than that of a via bottom side region based on the via bottom face in the case in which the internal wall surface is divided into the via opening side region and the via bottom side region with the step set to be a boundary.

(2) A method of manufacturing a multilayer wiring board having no core board and having a laminated structure in which a conductor layer and an insulating layer are alternately laminated into a multilayer, and having a main surface to which a device mounting region for mounting a semiconductor integrated circuit device is set, in which a plurality of via holes taking a shape of an inverse truncated cone and having steps on internal wall surfaces is formed to penetrate the insulating layer and a filled via conductor for electrically connecting the conductor layers is formed in each of the via holes, includes an insulating layer forming step of forming an insulating layer by using a sheet-like buildup material containing an inorganic fiber in a polymeric material. The method further includes a via hole forming step of irradiating a laser beam on the insulating layer to form a plurality of via holes and forming a step corresponding to a depth position in which the inorganic fiber is present in an internal wall surface of each of the vie holes, and a via conductor forming step of carrying out plating to form a filled via conductor in each of the via holes.

What is claimed is:

1. A multilayer wiring board having no core board, comprising:
    a laminated structure in which conductor layers and at least one insulating layer are alternately laminated into a multilayer, the insulating layer having a plurality of via holes penetrating the insulating layer and a plurality of filled via conductors formed in the via holes respectively for electrically connecting the conductor layers, each of the via holes taking a shape of an inverse truncated cone and having a step on an internal wall surface;
    wherein the step is a step of the via hole; and
    wherein an inclination angle of a via opening side region based on a via bottom face is greater than that of a via bottom side region based on the via bottom face in the case in which the internal wall surface is divided into the via opening side region and the via bottom side region with the step set to be a boundary.

2. The multilayer wiring board according to claim 1, wherein the insulating layer contains a fiber material in a polymeric material.

3. The multilayer wiring board according to claim 2, wherein the step is formed corresponding to a depth position in which the fiber material is present in the insulating layer.

4. The multilayer wiring board according to claim 2, wherein the step is formed corresponding to a depth position in which a protruded end of the fiber material is present.

5. The multilayer wiring board according to claim 1, wherein the insulating layer includes two types of buildup materials having different laser processing properties which are stuck together.

* * * * *